ically or semiconcentrically layered along the length of the wire so that the spaces or holes in the metal open radially of the wire or filament. The expanded or foraminous metal can be used in said wires or filaments as a strengthening layer, a conducting layer, or a diffusion barrier layer.

United States Patent [19]
McDonald

[11] 4,414,428
[45] Nov. 8, 1983

[54] EXPANDED METAL CONTAINING WIRES AND FILAMENTS

[75] Inventor: William K. McDonald, Salem, Oreg.

[73] Assignee: Teledyne Industries, Inc., Albany, Oreg.

[21] Appl. No.: 229,981

[22] Filed: Jan. 30, 1981

Related U.S. Application Data

[63] Continuation-in-part of Ser. No. 42,893, May 29, 1979, Pat. No. 4,262,412.

[51] Int. Cl.³ ............................................. H01B 5/00
[52] U.S. Cl. .................................. 174/126 S; 29/599; 174/126 CP; 174/126 CS; 428/609; 428/660
[58] Field of Search ............... 338/242, 286; 174/134, 174/126 S, 126 CP, 126 CS; 29/157.3 R, 163.5 F, 599; 219/270, 552; 428/609, 642, 660, 662, 615, 641

[56] References Cited

U.S. PATENT DOCUMENTS

| | | | |
|---|---|---|---|
| 2,731,713 | 1/1956 | Schaefer | 338/286 X |
| 2,989,145 | 6/1961 | Goodloe | 29/163.5 F X |
| 3,010,398 | 11/1961 | Parlanti | 428/609 X |
| 3,102,329 | 9/1963 | Horn et al. | 428/609 X |
| 3,175,893 | 3/1965 | Meretsky | 428/609 X |
| 3,345,734 | 10/1967 | Sowko | 428/609 X |
| 3,465,430 | 9/1969 | Barber et al. | 29/599 |
| 3,625,662 | 12/1971 | Roberts et al. | 174/126 S X |
| 3,636,620 | 1/1972 | Long | 29/599 X |
| 3,698,863 | 10/1972 | Roberts et al. | 428/660 X |
| 3,890,700 | 6/1975 | Diepers et al. | 174/126 S X |
| 3,918,998 | 11/1975 | Marancik et al. | 29/599 X |
| 3,976,434 | 8/1976 | Shwayder | 29/192.2 |
| 3,997,714 | 12/1976 | Letellier et al. | 174/34 |
| 4,003,762 | 1/1977 | Ceresara et al. | 29/599 X |
| 4,215,465 | 8/1980 | Dew-Hughes | 29/599 |
| 4,224,735 | 9/1980 | Young et al. | 29/599 |
| 4,262,412 | 4/1981 | McDonald | 29/599 |

Primary Examiner—Volodymyr Y. Mayewsky
Attorney, Agent, or Firm—Shoemaker and Mattare, Ltd.

[57] ABSTRACT

A wire filament or multifilament wire or cable having an expanded metal or foraminous metal concentrically or semiconcentrically layered along the length of the wire so that the spaces or holes in the metal open radially of the wire or filament. The expanded or foraminous metal can be used in said wires or filaments as a strengthening layer, a conducting layer, or a diffusion barrier layer.

20 Claims, 9 Drawing Figures

4,414,428

EXPANDED METAL CONTAINING WIRES AND FILAMENTS

CROSS REFERENCES TO RELATED APPLICATIONS

This application is a continuation-in-part of copending application Ser. No. 42,893 filed May 29, 1979, now U.S. Pat. No. 4,262,412, entitled "Composite Construction Process and Superconductor Produced Thereby."

BACKGROUND OF THE INVENTION

1. Field of the Invention

This invention relates to production of wires containing expanded or foraminous metal as either a reinforcing element or barrier layer. By expanded metal is meant metal that has been expanded to produce a foraminous or network structure therein.

2. Description of the Prior Art

In the past, composites for the production of rods, cables, or wires were produced by laminating the metals or combining them in some way and subsequently fabricating them to final dimensions.

As an example, methods of producing niobium tin-wire having fine continuous filaments have been costly and unreliable because niobium rods are used for forming the conductor filaments. The components for construction have dimensions of ⅛″ diameter or larger, thus requiring a great reduction to produce a wire with one micron diameter filaments. The wires are usually produced by placing the niobium rods in a bronze billet and extruding the billet several times to reach a certain size filament of the niobium rod. This wire produced is rebundled with other wires and again extruded. In the diffusion process whereby the tin in the bronze is diffused into the niobium, large Kirkendall voids are produced in the bronze when the niobium filaments are of large dimensions, over 10 microns. Large Kirkendall voids are detrimental to the wire.

Further, because these wires produced by the prior art processes are composed of individual and separate filaments, these filaments tend to break during the fabrication process because of being extruded from such a large diameter to such a small diameter. When individual filaments break, they cause a weakening of the bulk wire and eventually can cause the wire to break, thus decreasing the yield of usable product.

In other instances barrier layers are provided to prevent diffusion of reactive metals from one area, such as bronze-tin, into an area such as copper. In this case the billet is formed by circumferentially laminating a barrier layer onto the center rod of the billet between the layers to be protected from one another.

In normal present day processes, it is necessary to fabricate the wire billets through extrusion processes and to re-extrude several times to reach final dimensions where the wire is drawn through dies. Each of these extrusions is very hard on the filaments and is also very expensive to perform. It is, therefore, desirable that there be found another method of producing composites capable of being fabricated to form wires having fine niobium alloy filaments which are free of the detriments of past processes, i.e., expense and filament breakage.

BRIEF SUMMARY OF THE INVENTION

1. Objects of the Invention

It is, accordingly, one object of the invention to provide a wire or filament containing expanded or foraminous metal along the length of the wire or filament.

A further object of the present invention is to provide a process for producing a composite wire having expanded metal along the length of the wire or filament as a reinforcement concentric or semiconcentric layer.

Another object of the present invention is to provide a wire or filament and process of producing said wire or filament containing an expanded or foraminous metal layer longitudinally disposed in said wire concentrically or semiconcentrically as a diffusion barrier layer.

A still further object of the present invention is to produce a multifilament wire having filaments containing expanded or foraminous metal concentrically layered along the longitudinal axis of the filament for reinforcement purposes and/or as a diffusion barrier.

These and other advantages of the present invention will become apparent from the following detailed description and drawings.

In accordance with the above objects it has been found that metal composites of greater strength and better conductivity can be produced by having one layer of the composite in expanded or foraminous form. Specifically, wires or filaments or multifilament wires are produced containing expanded or foraminous metal as a diffusion barrier, strengthening or superconducting layer, either concentric or semiconcentric, along the length of the wire.

DETAILED DESCRIPTION OF THE INVENTION

Figure 1:
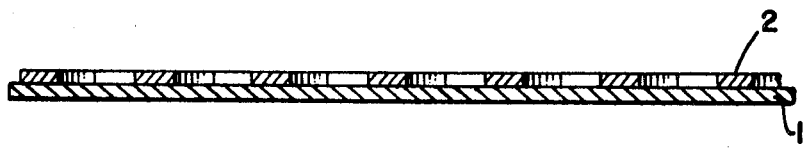
FIG. 1 is a cross-sectional view of a lamina consisting of a solid metal layer and an expanded metal layer.

This invention provides for the production of wires, filaments, or cables, rods and wires containing multifilaments which in themselves contain at least one concentric or semiconcentric layer of pure or laminated expanded or foraminous metal. This expanded or foraminous layer can be either laminated with another metal layer or it can be in its pure form having no other layers therewith. By semiconcentric is meant that where there are at least two component metals in the wire or filament, the expanded or foraminous layer can be in longitudinal strips along the length of the wire but not completely surrounding the wire.

This expanded metal layer can function in three categories. It can function as a strengthening layer, as a diffusion barrier between two layers that might react, and as a superconducting layer itself. When acting as a strengthening layer, it can be both in pure form and composite form, i.e., laminated to another metal prior to being used in the wire formation. In this form it can be made from Nb, Nb alloys (NbTi), Ta, Ta alloys, Ni, Ni alloys, V, and V alloys. In this function it can be a layer completely surrounding an inner layer of the wire material to be extruded, it can be between two layers, or it can be in strips not touching each other. However, it is always along the length of the wire or billet so that the spaces or holes in the expanded metal open radially of the wire or filament.

When the expanded metal is used as a superconducting filament, it can be made of all of the same metals as used when it functions as a strengthening material except for those materials which are not superconductors. It is also used in the structure in all of the above possible configurations set forth for strengthening materials. Its use in this regard as a superconductor is determined by the surrounding metals used in the formation of the wire or filament.

When the expanded metal material is used as a diffusion barrier, it is made from Nb, Ta, V, Ni, alloys of these metals either separately or in combination. Here again its function as a diffusion barrier will depend on the other metals used in the formation of the wire or billet or filament. There should be at least two other metals when used for this purpose.

The expanded metal when laminated with another metal can be wound upon itself in a jellyroll fashion to form a billet which is subsequently extruded to form wires and billets which can be combined to form multi-filament conductors. It is also possible that the expanded metal, either in the above-referenced laminated form or in its pure form, can be wound around a core material which is usually in the formation of a rod. This core material can have several functions, said functions determining its composition. When this core material is acting as a stabilizer, it can be formed from copper or aluminum. When it is being used for incorporating reactant elements, it can be made from tin, gallium, germanium, aluminum and silicon or combinations of these. It can be also made from copper, tin, bronze, copper-gallium-bronze, or tin-copper alloys having a small percentage of copper, i.e., 13% copper. When being used as a strengthening material, the core can be made of brass, bronze, reinforced copper, i.e., NbCu, Ni, Ni alloys, i.e., CuNi, and Al alloys. Here again the function of the core depends on the particular composite wire being formed. It is not necessary to always have a core material, but in certain instances it is efficacious for one or more of the above reasons.

In the making of these wires or filaments there is often used a ductile matrix material. This material can be made of the same material as the core material and can be used in the core of a wire. It can also be used as the material to which the expanded metal is laminated prior to wrapping around a core or being jellyrolled upon itself for purposes of producing the billet from which the wire or filaments are extruded. This material can also be used in the outside cladding or casing of the billet. As its name signifies, the material lends ductility to the billet which aids in the extrusion thereof.

In the making of a billet there is often used a surrounding or cladding material to aid in the drawing of the billet into wire or filaments. This material can be copper, nickel, aluminum, or bronze containing reactant materials such as tin, gallium, germanium, aluminum, silicon and combinations of these.

Specifically, in the present invention it has been found that many of the problems of the past methods of producing composites, particularly superconductor wires having fine filaments, can be solved by using expanded metal as opposed to metal rods. This expanded metal has many advantages of prior processes. It allows a greatly increased versatility and composite design, much finer filaments with less reduction required, a uniform conductor cross section while still having the advantages of a single fine filament. These advantages are attributed to the use of a finer starting material, therefore requiring less reduction to achieve even finer filaments than prior methods. Because the starting size of the conductor is fine, final dimensions of the superconductor can be sufficiently fine to allow for short reaction times, thereby reducing Kirkendall void formation and utilizing the ductile characterisics of extremely fine filaments of brittle metal compounds.

By means of the present process, one can produce a long length conductor with fine conductor filaments at a much lower cost than present processes. This is because the starting material is of very fine dimensions requiring less reduction. Because of the decreased threat of breakage, it is possible by the present method to produce long unbroken lengths which are extremely difficult to achieve using present-day methods.

Figure 3:
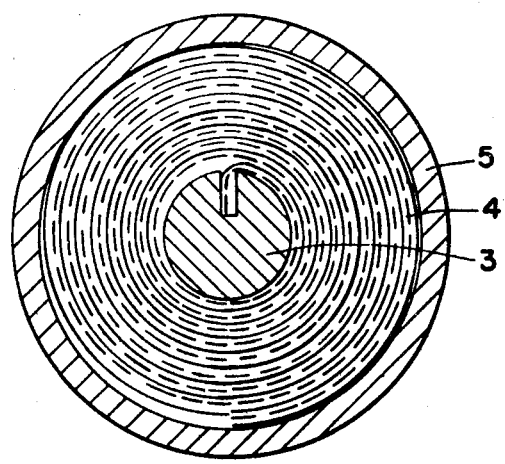
FIG. 3 is a cross-sectional of a billet rolled from the lamina of FIG. 1 around a copper rod and clad in copper.
Figure 2:
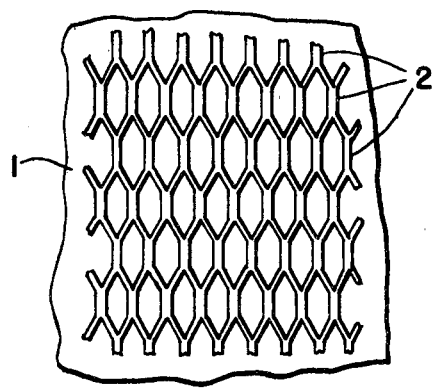
FIG. 2 is a top view of FIG. 1 showing the expanded metal layer overlaying a solid metal layer.

In accordance with the present invention of making wires, one method is by taking a lamina as shown in FIGS. 1 and 2, wherein a bronze layer (1) is layered with a layer of expanded niobium metal (2). The bronze layer is used to supply tin to the niobium. It has been found that the tin can be diffused into the niobium in this way, and, therefore, the bronze layer is needed so as to diffuse the tin into the niobium and produce $Nb_3Sn$. This method has the desirable reaction kinetics for the solid state diffusion reaction since it is more difficult for the tin to be placed on the niobium and achieve the same. The bronze is of standard specificatons and contains anywhere from 10 to 14% tin. This lamina is then rolled like a jellyroll around a copper core rod as shown in FIG. 3 and marked 3. The bronze-niobium layer (4) is wound around the copper rod (3) and subsequently clad with an outer layer of copper (5), forming a billet having the cross-sectional shown in FIG. 3.

The copper cladding is helpful to facilitate fabrication, making it easy to draw the wire. It further provides cryogenic stability having high thermal conductivity. The wire then can be reduced and drawn into any cross-sectional shape, i.e., round, square, elliptical, or flat.

Figure 4:
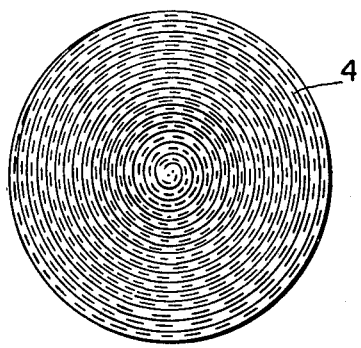
FIGS. 4, 5, 6, 7, 8, and 9 are various cross sections of wires, filaments, or billets produced by the process of this invention.

It is also possible to produce a billet for extrusion into a wire or filament wherein no core material is used, the lamina of FIG. 1 being jellyrolled upon itself, having a cross section as shown in FIG. 4.

A specific example illustrating the process is shown in FIGS. 1 and 3 wherein the laminar layer is that of a tin-bronze, and an expanded Nb metal is shown in Example 1.

EXAMPLE 1

One billet has been constructed, 2.375 inch outside diameter × 6 inches long, with approximately 8% Nb by cross section. The billet was fabricated to 0.020 inch diameter wire by conventional methods, reacted by coventional methods, and shown to have excellent superconducting properties.

TABLE I

Critical Current (Amps) in 0.020" diameter wire, nominally 8% Nb wire cross-sectional area = $2.0 \times 10^{-3}$ cm$^2$; Superconductor area is 8% of $2 \times 10^{-3}$ cm$^2$ = $1.6 \times 10^{-4}$ cm$^2$ - final heat treatment at 800° C. for 15 minutes.

| Test Temp. (°K.) | Strain (Bend Radius) | 0T | 1T | 2T | 3T | 4T | 5T | 6T | 7T | Comment |
|---|---|---|---|---|---|---|---|---|---|---|
| 4.2° K. | 0 | 590A | — | — | — | — | — | — | — | Test Lab #1 |
| 14° K. | 0 | 160A | — | — | — | — | — | — | — | Test Lab #1 |
| 15° K. | 0 | 90A | — | — | — | — | — | — | — | Test Lab #1 |
| 16° K. | 0 | 30A | — | — | — | — | — | — | — | Test Lab #1 |
| 17.6° K. | 0 | 0A | — | — | — | — | — | — | — | Test Lab #1 |
| 4.2° K. | 0 | — | — | 88A | — | 76.5A | 64A | 55A | — | Test Lab #2 |
| 4.2° K. | ⅜" r | 370A | 210A | 151A | 105A | 76A | 41A | 47A | 38A | Test Lab #3 |
| As Drawn wire (no final Heat Treatment) | | | | | | | | | | |
| 11° K. | 0 | 0A | — | — | — | — | — | — | — | Critical Temp. |

A single, unbroken coil nominally 5000' long was produced with Nb filaments having one dimension of one micron. As shown in TABLE I, the $T_c$ measured on the wire prior to final stage reaction heat treatment is 11° K., about 2° K. higher than pure Nb. This improved $T_c$ over pure Nb is the result of reaction of the Sn from the bronze with the Nb to form very fine Nb$_3$Sn during processing anneals at 600° C.

FIGS. 5 through 9 illustrate various cross sections of billets, wires, or filaments which have been fabricated for various functions and reasons.

Figure 5:
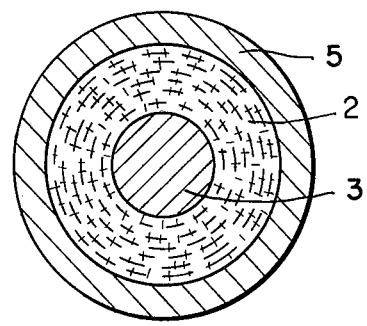

FIG. 5 is illustrative of the use of a non-laminated pure expanded metal (2) wrapped around a core (3) similar to that shown in FIG. 3 and cladded with a cladding material (5). This cross section depicts the use of the expanded metal as a strengthening material only. This is sometimes used to produce strong filaments which may be used in conjunction with conducting filaments. This is because the conducting fialments are not as strong due to the reactant materials contained therein. In that case, when a multifilament wire, cable or rod is formed some of the filaments are merely strengthening filaments having a cross section like FIG. 5 to lend strength to the conducting filaments such as those shown in FIGS. 3, 4, 6, 7, 8, and 9.

Figure 6:
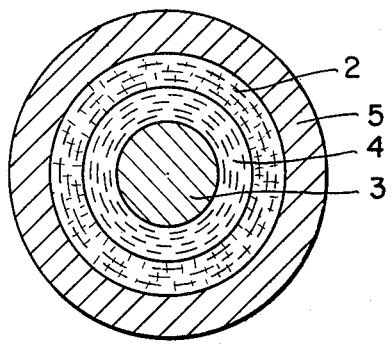

FIG. 6 illustrates the use of pure expanded metal (6) being used as a diffusion barrier. In this cross section of the wire or billet there's shown a core material (3) and a reactant containing material (4) formed in the same way as that of FIG. 3. The diffusion barrier prevents the reactant material in layer 4 from reacting with the cladding material (5) which would decrease the ability of the cladding layer to be a stabilizing conductor. Instead, the reactant material will react with the diffusion barrier material which is a much slower reaction.

Figure 7:
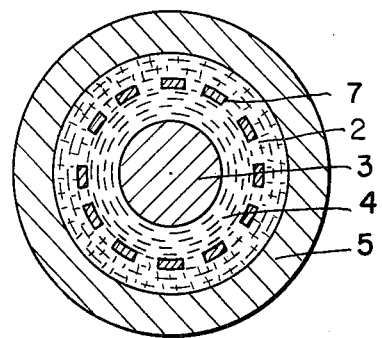

FIG. 7 is a similar cross section to FIG. 6. However, there is contained therein strips of barrier material such as phosphor-bronze (7) which prevents the reaction of the reactants with the diffusion barrier in certain areas so as to decrease this reaction. This is sometimes desirable when the conductive material is being protected in that the diffusion of the reactant material into the expanded metal can cause the expanded metal to become a conducting ring around the superconducting material inside. When this happens it sometimes causes a condition known as flux jumping which can set up resistance losses, producing an unstable condition in the conductor. This usually occurs more readily where alternating current is used as opposed to direct current.

Figure 8:
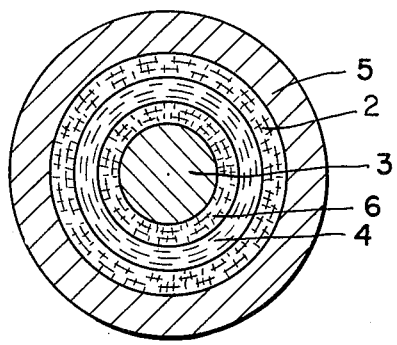

FIG. 8 is a cross section of a billet of wire wherein two diffusion barriers are used when it is desired to protect not only the cladding material from the conducting material (4), but also to protect the core material from the same conducting material (4).

Figure 9:
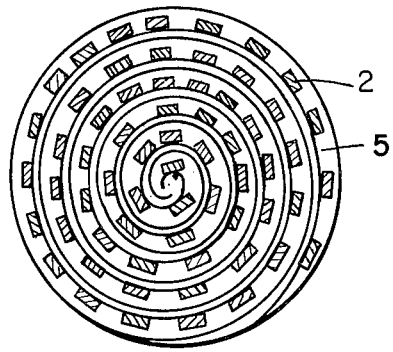

FIG. 9 shows the cross section of a billet wherein the foraminous metal is cut into strips and incorporated in a jellyroll configuration contained in a ductile matrix material.

The following examples will illustrate the present invention in more detail. A series of bronze billets was made having certain compositions and sizes and fabricated into wires. These billets are set forth in TABLE I where the remarks column indicates certain observations on fabrication. In can be seen from TABLE I that these correspond to various figure cross sections in the drawings.

TABLE I

(BRONZE BILLETS)

| Examples | Composition by Volume | REMARKS |
|---|---|---|
| M<br>2⅜" diameter<br>Core (16.7% Nb/Bz)<br>Cu Clad | Nb = 8%<br>Bz = 40%<br>Cu = 52%<br>Bz/Nb = 5/1 | (a) 5000' coil at 0.020" diameter.<br>(b) 1µ filaments.<br>(c) NO DIFFUSION BARRIER. |
| *M-1<br>3" diameter<br>Core (23.3% Nb/Bz)<br>Cu Clad | Nb = 9%<br>Bz = 30%<br>Cu = 57.5%<br>Ta = 3.6%<br>Bz/Nb = 3.3/1 | (a) Rebundled 11-strand for 0.150" × .310" Lawrence Livermore Lab bar contained 5.41% Nb.<br>(b) Rebundled 19-strand for .150 × .310" Lawrence Livermore Lab bar, 6.38% Nb.<br>(c) Ta diffusion barrier inside and out (.0015" foil) outside layer tore during bundling of original billets - caused breakage and loss of barrier. |
| *M-2<br>3" diameter<br>Core (33.3% Nb/Bz)<br>Cu Clad | Nb = 9%<br>Bz = 18%<br>Cu = 83%<br>Bz/Nb = 2/1 | (a) Ta diffusion barrier tore during construction causing wire breakage and loss of barrier.<br>ABANDONED. |
| M-3 | Nb = 15.25% | (a) NO DIFFUSION BARRIER. |

TABLE I-continued
(BRONZE BILLETS)

| Examples | Composition by Volume | REMARKS |
|---|---|---|
| 3" diameter<br>Core (33.3% Nb/Bz)<br>Cu Clad | Bz = 30.50%<br>Cu = 54.25%<br>Bz/Nb = 2.0/1 | (b) Coil drew to 0.065" diameter without breakage and 3-5 μ filaments.<br>(c) Combined with M-6 to make 19-strand but internal rupture at 0.310" diameter developed because M-6 had torn Ta diffusion barrier. |
| M-4<br>3" diameter<br>Core (27% Nb/Bz)<br>Cu Clad | Nb = 11.9%<br>Bz = 32.0%<br>Cu = 56.1%<br>Bz/Nb = 2.7/1 | (a) NO DIFFUSION BARRIER.<br>(b) Drew to 0.058" diameter without breakage 2-5μ filaments. |
| M-5<br>3" diameter<br>Core (15.4% Nb/Bz)<br>Cu Clad | Nb = 6.38%<br>Bz = 35.0%<br>Cu = 58.5%<br>Bz/Nb = 5.5/1 | (a) NO DIFFUSION BARRIER.<br>(b) Drew to 0.025" diameter, 5640' coil 1-3μ filaments.<br>(c) Breakage began at 0.016" diameter. |
| *M-6<br>3" diameter<br>Core (20% Nb/Bz)<br>Cu Clad | Nb = 5.74%<br>Bz = 23.0%<br>Cu = 71.3% (+Ta diffusion barrier)<br>Bz/Nb = 4/1 | (a) Ta diffusion barrier (0.0015" foil) tore during construction.<br>(b) Breakage began at 0.037" diameter 1-2μ filaments.<br>(c) Rebundle with M-3 for 19-strand broke at 0.310" diameter because of Ta. |
| *M-7<br>3" diameter<br>Core & Wrap (17.2% Nb/Bz)<br>(22% Nb/Bz in wrap**)<br>Cu Clad | Nb = 11.7%<br>Bz = 56% (total)<br>Cu = 30.4%<br>Bz/Nb = 4.1/1 (in wrap**)<br>Bz/Nb = 4.8/1 (overall) | (a) (0.005") Ta = 2.0% diffusion barrier.<br>(b) Samples at 0.035" diameter where first breakage began.<br>(c) Samples: 0.020" dia., 0.015" dia., 0.012" diam.<br>(d) Rebundle with M-8 (17 pcs.).<br>(e) BRONZE CORE ROD. |
| *M-8<br>3" diameter<br>Core & Wrap and Diffusion Barrier (20.6% Nb/Bz)<br>(18.5% Nb/Bz in wrap**)<br>Cu Clad | Nb = 10.7%<br>Bz = 54.4% (total)<br>Cu = 31.5%<br>Bz/Nb = 4.4/1 (in wrap**)<br>Bz/Nb = 3.86/1 (overall) | (a) (0.010") Nb = 3.4% diffusion barrier.<br>(b) Samples at 0.035" diameter where first breakage began.<br>(c) BRONZE CORE ROD. |
| *M-7/M-8<br>REBUNDLE<br>3" dia./0.3" hexagonal bars<br>(24.2% Nb/Bz)<br>Cu Clad | Nb = 8.95%<br>Bz = 36.96%<br>Cu = 54.09%<br>Bz/Nb = 4.13/1 (overall) | 17 pieces M-7 0.3" hexagonal.<br>38 pieces M-8 0.3" hexagonal. |
| M-9<br>3" diameter<br>(25.6% Nb/Bz)<br>Cu Clad | Nb = 17.6%<br>Bz = 51.1%<br>Cu = 31.1%<br>Bz/Nb = 2.9/1 | (a) Cu core rod (R-3), ⅞" diameter.<br>(b) With Nb expanded metal diffusion barrier on outside diameter of the wrap**. |
| M-10<br>3" diameter | Nb = 17.4%<br>Bz = 56.8%<br>Cu = 25.8%<br>Bz/Nb = 2.89/1 (wrap**)<br>Bz/Nb = 3.27/1 (overall) | (a) Bz core rod, ⅞" diameter.<br>(b) Nb expanded metal on outside diameter of wrap**.<br>(c) With Phosphor-bronze strips, 6 pcs., ¾" wide laid lengthwise. |
| M-11<br>3" diameter<br>(24.0% Nb/Bz)<br>Cu Clad | Nb = 16.9%<br>Bz = 58.3%<br>Cu = 24.5%<br>Bz/Nb = 3.16/1 (in wrap**)<br>Bz/Nb = 3.45/1 (overall) | (a) Bz core rod, ⅞" diameter.<br>(b) Nb expanded metal on outside diameter of wrap**. |
| M-12<br>3" diameter | Nb = 17.2%<br>Bz = 51.0%<br>Cu = 25.8%<br>Bz/Nb = 2.8/1 (wrap**)<br>Bz/Nb = 3.32/1 (overall) | (a) Bz core rod, ⅞" diameter.<br>(b) Nb expanded metal on outside diameter of wrap**.<br>(c) Phosphor bronze wrap to protect diffusion barrier |

*Diffusion barrier foil wrap not expanded metal.
**Wrap in jellyroll configuration.
M-9, M-11, M-12 correspond to FIG. 6.
M-10 corresponds to FIG. 7.

Some further billets were made and tested for strength. These billets were fabricated according to the processes of the present invention and had the dimensions and compositions set forth in TABLE II. They were then tested for strength and the result are set forth in TABLE III.

TABLE II
R-BILLETS (CONSTRUCTION DETAILS)

| Examples | | Composition by Volume |
|---|---|---|
| R-3 | Length 75⅞" Nb expanded metal wrapped on core | 5% Nb |
| | Cu Core 2.29"∅ | 95% Cu |
| | Cu Cladding 3" OD × .25" wall | |
| R-4 | Length 79½" Nb expanded metal wrapped on core | 2% Nb |
| | Cu Core 2.29"∅ | 98% Cu |
| | Cu Cladding 3" OD × .25" wall | |
| R-5 | Length 50¼" Nb expanded metal wrapped on core | 2.6% Nb |
| | Cu Core 2.29"∅ | 97.4% Cu |
| | Cu Cladding 3" OD × .25" wall | |
| R-6 | Length 43" Nb expanded metal laminated on Cu foil | 2.8% Nb |

TABLE II-continued

R-BILLETS (CONSTRUCTION DETAILS)

| Examples | | Composition by Volume |
|---|---|---|
| | 0.005" thick jellyrolled on core | 97.2% Cu |
| | Cu Core 2.29"∅ | |
| | Cu Cladding 3" OD × .25" wall | |
| R-7 | Length 280¾" Nb expanded metal laminated on | 25.0% Nb |
| | Cu foil 0.005" thick jellyrolled on core | 75.0% Cu |
| | Cu Core ¾"∅ | |
| | Cu Cladding 3" OD × .2" wall | |
| R-8 | Length 323" Nb expanded metal laminated on | 12.0% Nb |
| | Cu foil 0.005" thick jellyrolled on core | 88.0% Cu |
| | Cu Core ¾"∅ | |
| | Cu Cladding 3" OD × .2" wall | |
| R-9 | Length 180" Nb expanded metal laminated on | 11.63% Nb |
| | Cu foil .010" thick jellyrolled on core | 88.37% Cu |
| | Cu Core ¾"∅ | |
| | Cu Cladding 3" OD × .2" wall | |
| R-10 | Length 209" Nb expanded metal laminated on | 15.72% Nb |
| | Cu foil .010" thick jellyrolled on core | 84.28% Cu |
| | Cu Core ¾"∅ | |
| | Cu Cladding 3" OD × .2" wall | |
| R-11 | Length 168" Nb expanded metal laminated on | 11.9% Nb |
| | Cu foil 0.15" thick jellyrolled on core | 88.1% Cu |
| | Cu Core ¾"∅ | |
| | Cu Cladding 3" OD × .2" wall | |
| R-12 | Length 168¼" Nb expanded metal laminated on | 12.9% Nb |
| | Cu foil .015" thick jellyrolled on core | 87.1% Cu |
| | Cu Core ¾"∅ | |
| | Cu Cladding 3" OD × .2" wall | |

TABLE III

TENSILE STRENGTH OF Cu/Nb WIRE

| Overall (% Nb) | Examples | Anneal | Diameter | Ultimate Tensile Strength KSI Hi/Lo | Yield Tensile Strength KSI Hi/Lo | % Elongation Hi/Lo |
|---|---|---|---|---|---|---|
| (25.0) | R-7-1 | 315° C./10 min. | .010 | 102/98.1 | 66.2/59.9 | 7/3 |
| (15.7) | R-10-1 | 315° C./10 min. | .010 | 87.9/86.6 | 49.7/42.0 | 9/5 |
| (11.9) | R-11-1 | 315° C./10 min. | .010 | 75.2/73.9 | 44.6/38.2 | 13/8 |
| (12.9) | R-12-1 | 315° C./10 min. | .010 | 71.3/70.1 | 43.3/39.5 | 14/10 |
| | R-7-1 (4 pcs) | 315° C./10 min. | .025 | 69.5/67.8 | 38.3/32.6 | 18/10 |
| *(25.0) | R-7-2 | 315° C./10 min. | .025 | 71.9/69.8 | 39.5/34.2 | 20/15 |
| | R-8-1 (1 pc) | 315° C./10 min. | .025 | 47.7/46.0 | 28.1/24.8 | 25/12 |
| *(12.0) | R-8-2 | 315° C./10 min. | .025 | 48.3/46.6 | 22.2/20.4 | 17/15 |
| | R-10-1 (1 pc) | 315° C./10 min. | .025 | 62.9/61.5 | 34.2/33.4 | 18/15 |
| *(15.7) | R-10-2 | 315° C./10 min. | .025 | 64.4/62.7 | 33.2/31.4 | 23/12 |
| | R-11-1 (1 pc) | 315° C./10 min. | .025 | 53.8/53.4 | 29.7/26.5 | 21/18 |
| *(11.9) | R-11-2 | 315° C./10 min. | .025 | 56.0/55.4 | 26.5/22.8 | 30/25 |
| | R-12-1 (4 pcs) | 315° C./10 min. | .025 | 52.5/51.9 | 30.3/29.1 | 25/22 |
| *(12.9) | R-12-2 | 315° C./10 min. | .025 | 54.2/53.6 | 27.1/23.2 | 31/20 |

*Example with in process Cu anneal (all other examples without in process Cu anneal).
Hi/Lo = High and Low values out of five tests.

As this invention may be embodied in several forms without departing from the spirit or essential characteristics thereof, the present embodiment is, therefore, illustrative and not restrictive, since the scope of the invention is defined by the appended claims rather than by the description preceding them, and all changes that fall within the mete and bounds of the claims or that forms their functional as well as conjointly cooperative equivalent are, therefore, intended to be embraced by those claims.

I claim:

1. An extruded metal wire having at least two layers coaxially laminated upon and to each other and wherein at least one layer is foraminous metal.

2. The wire of claim 1 wherein the foraminous metal is an expanded metal.

3. The wire of claim 2 wherein the expanded metal is used as a strengthening material and is selected from the group consisting of Nb, Ta, Ni, V, and alloys thereof.

4. The wire of claim 1 wherein the foraminous metal acts as a conductor and there are reactant elements in the other metal.

5. The wire of claim 1 wherein there are at least three metals and the foraminous metal acts as a diffusion barrier.

6. The wire of claim 5 wherein the foraminous metal acts as a diffusion barrier and is selected from the group consisting of Nb, Ta, V, Ni, and alloys thereof.

7. The wire of claim 5 wherein there is contained longitudinal strips of a barrier layer between the diffusion barrier and a reactant layer.

8. The wire of claim 1 wherein the foraminous metal acts as a conductor and is selected from the group consisting of Nb, Ta, V, and alloys thereof.

9. The wire of claim 1 wherein the foraminous metal is wrapped around a core metal.

10. The wire of claim 9 wherein the core acts as a stabilizer and is selected from the group consisting of Cu and Al.

11. The wire of claim 9 wherein the core contains at least one reactive element selected from the group consisting of Sn, Ga, Ge, Al, Si, CuSn, CuGa, SnCu, and combinations of these.

12. The wire of claim 9 wherein the core acts as a strengthening material and is formed from a metal selected from the group consisting of brass, bronze, reinforced copper, Ni alloys and Al alloys.

13. The wire of claim 1 wherein the foraminous metal is contained in a ductile matrix material.

14. The wire of claim 13 wherein the ductile matrix material is a metal selected from the group consisting of Cu, Al, bronze, tin, nickel, and brass.

15. The wire of claim 1 being contained in a cladding material.

16. The wire of claim 15 wherein the cladding material is formed from a metal selected from the group consisting of Cu, Ni, Al and bronze.

17. The wire of claim 16 wherein the cladding material is bronze containing reactant materials selected from the group consisting of Sn, Ga, Ge, Al and Si.

18. The wire of claim 1 wherein the foraminous metal is laminated to a ductile matrix material.

19. The wire of claim 1 wherein the two layers form coaxial circles.

20. The wire of claim 1 wherein the two layers form coaxial spirals.

* * * * *